(12) United States Patent
Guillot

(10) Patent No.: US 8,781,046 B2
(45) Date of Patent: Jul. 15, 2014

(54) DEVICE FOR RECONSTRUCTING THE CLOCK OF AN NRZ SIGNAL, AND ASSOCIATED TRANSMISSION SYSTEM

(75) Inventor: François Guillot, Paris (FR)

(73) Assignee: Sagem Defense Securite, Paris (FR)

( * ) Notice: Subject to any disclaimer, the term of this patent is extended or adjusted under 35 U.S.C. 154(b) by 381 days.

(21) Appl. No.: 13/123,894

(22) PCT Filed: Oct. 13, 2009

(86) PCT No.: PCT/EP2009/063345
§ 371 (c)(1),
(2), (4) Date: Jun. 28, 2011

(87) PCT Pub. No.: WO2010/043614
PCT Pub. Date: Apr. 22, 2010

(65) Prior Publication Data
US 2011/0249781 A1    Oct. 13, 2011

(30) Foreign Application Priority Data

Oct. 13, 2008  (FR) ...................................... 08 56916

(51) Int. Cl.
*H04L 7/00* (2006.01)
(52) U.S. Cl.
USPC ........................................................ 375/354
(58) Field of Classification Search
USPC .................. 375/372, 373, 374, 375, 376, 354
See application file for complete search history.

(56) References Cited

U.S. PATENT DOCUMENTS 5,127,026 A    6/1992  Kelly et al.
5,164,966 A *  11/1992 Hershberger ................. 375/359
(Continued)

FOREIGN PATENT DOCUMENTS

EP    0 499 479    8/1992
EP    0 502 739    9/1992
(Continued)

*Primary Examiner* — Jaison Joseph
(74) *Attorney, Agent, or Firm* — Blakely Sokoloff Taylor & Zafman

(57) ABSTRACT

The invention relates according to a first aspect to a device (1) for reconstructing a clock signal from a baseband serial signal (NRZ-D), comprising: —a pulse generating circuit (2) adapted for generating pulses at each transition, rising or falling, of the baseband serial signal (NRZ-D); —a phase-locked loop (5) comprising a voltage-controlled oscillator (6) which generates an oscillator output signal (VCO-S) and a filter (7) delivering a setpoint signal (VCO-E) to the oscillator (6), the phase-locked loop (5) furthermore comprising a breaker (8) interposed between the oscillator (6) and the filter (7), the switching of which is controlled by the output (Cde-S) of the pulse generating circuit (2), and in that the filter (7) is a low-pass filter, such that: —in the presence of a pulse generated by the pulse generating circuit (2), the breaker (8) is closed and the filter (7) then averages the oscillator output signal (VCO-S) passing through the breaker so as to deliver the setpoint signal (VCO-E) to the oscillator; —in the absence of a pulse generated by the pulse generating circuit (2) the breaker (8) is open and the filter (7) then stores a signal of constant level so as to deliver the setpoint signal (VCO-E) to the oscillator; the device being characterized in that it furthermore comprises a decision flip-flop (9) making it possible to resynchronize the baseband serial signal by copying said signal at each falling edge of the oscillator output signal (VCO-S).

12 Claims, 3 Drawing Sheets

(56) References Cited

U.S. PATENT DOCUMENTS

| | | |
|---|---|---|
| 7,102,447 B2 * | 9/2006 | Mattisson et al. ............. 331/16 |
| 7,362,185 B1 * | 4/2008 | Yildiz et al. .................... 331/17 |
| 2006/0290437 A1 * | 12/2006 | Kimura ........................ 332/127 |
| 2009/0220232 A1 * | 9/2009 | Sarashina ...................... 398/77 |

FOREIGN PATENT DOCUMENTS

| | | |
|---|---|---|
| EP | 0 778 675 | 6/1997 |
| JP | 58 095430 | 6/1983 |
| JP | 03 019520 | 1/1991 |

* cited by examiner

DEVICE FOR RECONSTRUCTING THE CLOCK OF AN NRZ SIGNAL, AND ASSOCIATED TRANSMISSION SYSTEM

This is a non-provisional application claiming the benefit of International application number PCT/EP2009/063345 filed Oct. 13, 2009.

BACKGROUND OF THE INVENTION

1. Field of the Invention

The field of the invention is that of transmission of digital data over a baseband serial link between a transmitter and a receiver linked by a communication channel.

The invention relates more particularly to a device for reconstructing the clock signal of the baseband serial message transmitted over such a communication channel, as well as a data transmission system incorporating such a device.

In baseband serial digital links, it is necessary, at the receiver, to extract from the received signal both the digital data transmitted serially by that received signal and the clock signal corresponding to those data.

2. Description of Related Art

Two methods are known for recovering the bit timing from the received signal.

According to a first method, the clock signal is sent by superimposing it on the data signal on the transmission channel. This first method has the disadvantage of consuming part of the transmitted power needed for the signal, as well as part of the usable passband of the transmission channel.

According to a second method, the clock is reconstructed from the transitions in the signal. It is therefore necessary to transmit signals such that the receiver can find many transitions, even for sequences of identical bits. This constraint excludes the use of NRZ (non-return to zero) coding.

Currently, clock extraction circuits are generally made based on a phase-locked loop, or PLL, which is made up essentially of a phase comparator which provides a setpoint signal to a voltage-controlled oscillator via a loop filter. Thus, a PLL achieves constant phase matching of the clock signal provided by the oscillator with the received signal by slightly altering the oscillator frequency to correct any possible phase offset.

More specifically, when the signals (clock and data) are out of phase, the phase comparator generates an error voltage. The loop filter filters this error voltage and its average voltage directly controls the oscillator. When the loop is locked, however, the two signals are in phase and no error voltage is generated.

In the case of data transmissions including long sequences of identical bits (hence with no transitions, which is the case with NRZ coding in particular), no error voltage is available and the oscillator is then liable to drift and to break the lock.

Apart from its relative simplicity, however, NRZ coding has the advantage of having a relatively limited spectrum, which makes it possible to consider its use on narrowband media because the spectrum use of the signal is then limited, or in applications requiring that the passband occupied by the serial data transmission be minimized. NRZ coding in particular proves advantageous in the case where a single shared transmission line is used for the transmission of electrical power and bidirectional data between, a transmitter and a receiver.

BRIEF SUMMARY OF THE INVENTION

The invention has as its object to offer a technique allowing the clock signal of a baseband serial message to be reconstituted from the signal's transitions, which allows good insensitivity to the absence of transitions. In particular, the invention aims to allow the reconstruction of the clock from the transitions of an NRZ signal.

To this end, the invention offers, according to a first aspect, a device for reconstructing a clock signal of a baseband serial signal, including:

a pulse generator circuit designed to generate pulses at each transition, rising or falling, of the baseband serial signal;

a phase-locked loop including a voltage-controlled oscillator which generates an oscillator output signal and a filter supplying a setpoint signal to the oscillator, the phase-locked loop also including a switch, inserted between the oscillator and the filter, whose switching is controlled by the output of the pulse generator circuit, and wherein the filter is a low-pass filter, such that:

in the presence of a pulse generated by the pulse generator circuit, the switch is closed and the filter then averages the oscillator output signal running through the switch to provide the setpoint signal to the oscillator;

in the absence of a pulse generated by the pulse generator circuit, the switch is open and the filter then stores a constant-level signal to provide the setpoint signal to the oscillator, wherein the device also includes a flip-flop allowing resynchronization of the baseband serial signal by reproducing the said signal at each falling wavefront of the oscillator output signal.

Certain preferred, but not limiting, aspects of this device are the following:

the pulse generator circuit generates pulses whose duration corresponds to a half-period of the data bit of the baseband serial signal;

the pulse generator circuit includes a delay line to delay the baseband serial signal by one half-period of the data bit of the said baseband serial signal, and an exclusive-OR logic gate allowing comparison of the baseband serial signal and the baseband serial signal delayed by the delay line;

the delay line is a distributed constant line;

the pulse generator circuit is incorporated into a monolithic integrated circuit;

the low-pass filter includes selected capacitors such that:

once the loop is locked, when the switch is closed, they are charged if the oscillator output signal is in the high state, or are discharged if the oscillator output signal is in the low state, so as to provide an average setpoint signal to the oscillator;

when the switch is open, they store the voltage so as to provide a constant setpoint signal to the oscillator;

the pass-band filter has two cutoff frequencies: a first, lower cutoff frequency providing the storage function in the case of an absence of transitions in the baseband serial signal, and a second, upper cutoff frequency providing filtering of phase noise in the received message;

the oscillator is a voltage-controlled quartz oscillator;

the baseband serial signal is an NRZ signal;

the baseband serial signal is received from a transmission line carrying the rising or falling edges of the baseband serial signal, and also including a Schmitt trigger capable of reconstructing the binary states of the message of the baseband serial signal; and the device also includes an inverter allowing inversion of the oscillator output signal to obtain the reference clock for sampling the resynchronized output message.

According to a second aspect, the invention offers a system for transmitting digital data over a baseband serial link, wherein the receiver includes a device according to the first aspect of the invention.

BRIEF DESCRIPTION OF THE DRAWINGS

Other aspects, objects and advantages of the present invention will appear more clearly upon reading the following detailed description of its preferred embodiments, given here as non-limiting examples and with reference to the attached drawings in which.

DETAILED DESCRIPTION OF THE INVENTION

Figure 1:
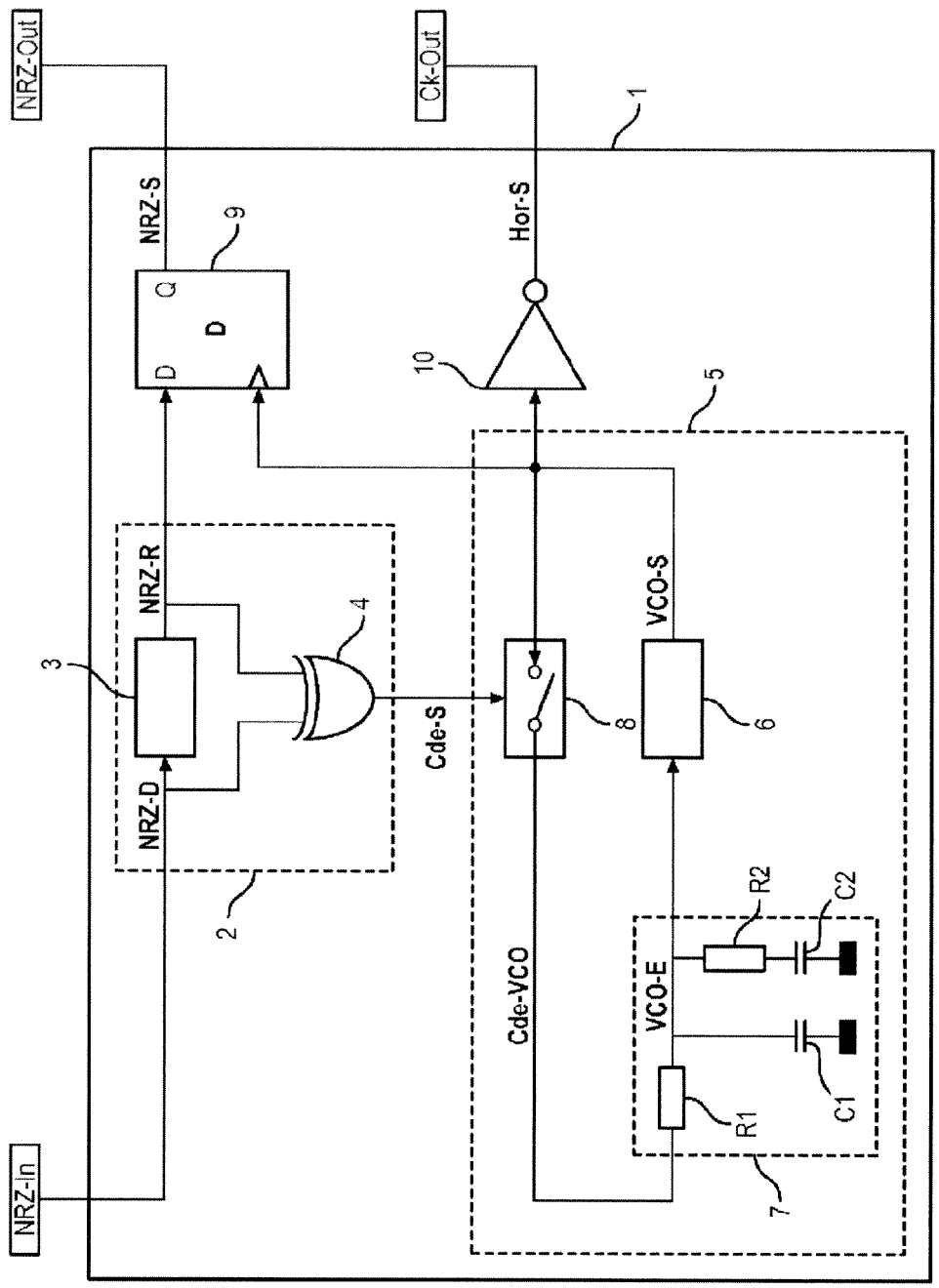
FIG. 1 is a schematic showing one possible embodiment of the device according to the first aspect of the invention.

Referring to FIG. 1, a device 1 is shown for reconstructing the clock signal of a baseband serial signal according to a possible embodiment of the first aspect of the invention.

Such a device 1 is typically intended to be incorporated into a receiver connected to a transmitter through a communication channel. It is noted here that in the context of bidirectional data transmission between the transmitter and the receiver, the transmitter also incorporates a clock reconstruction device in compliance with the first aspect of the invention.

Within the framework of the invention, the baseband serial message whose transitions will be used in reconstructing its clock is typically an NRZ message. The invention is not limited, however, to this particular coding, and is well suited to be extended to other types of coding, and particularly to coding schemes that do not show transitions during sequences of identical bits.

In FIG. 1, the label "NRZ-In" represents the NRZ-D serial digital message received at the input of the clock reconstruction device 1. As for the labels "NRZ-OUT" and "Ck-OUT," they represent the outputs of the clock reconstruction device 1, to wit the resynchronized digital message NRZ-S and the reference clock Hor-S for use in sampling the resynchronized received digital message NRZ-S, respectively.

Figure 2:
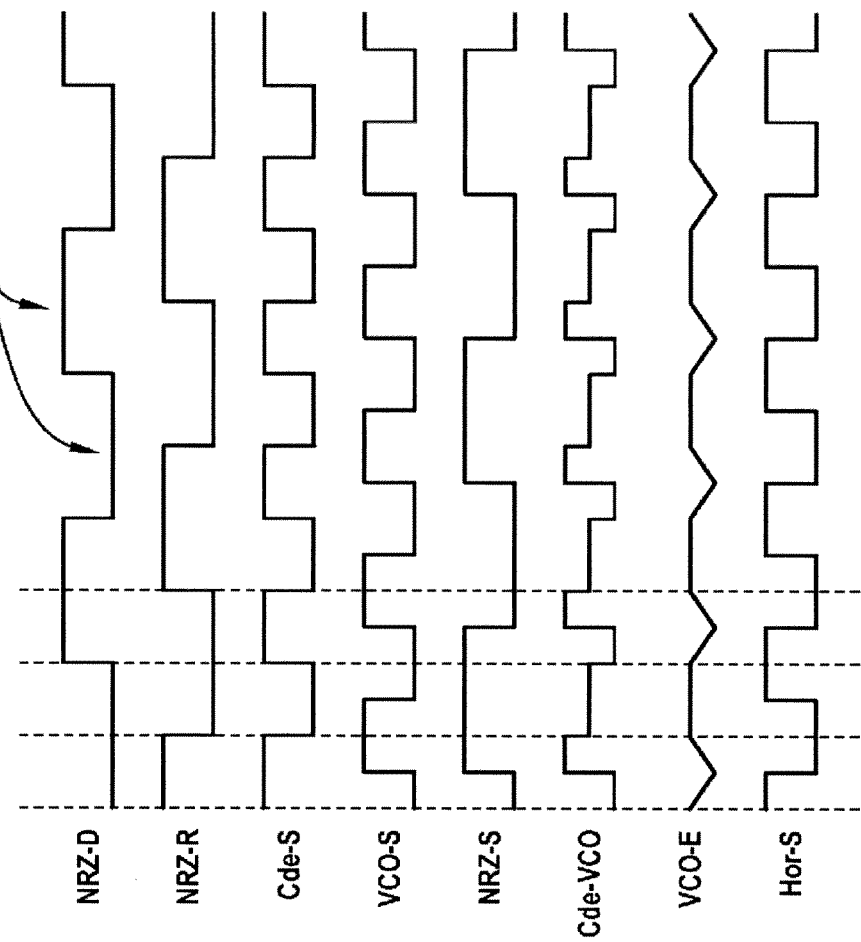
FIG. 2 shows timing diagrams of the different signals in FIG. 1.

As shown on the timing diagram in FIG. 2, the received serial digital message NRZ-D available at the input of the clock reconstruction device is made up of a sequence of binary states showing an absence of AT transitions during a succession of identical bits.

Figure 3:
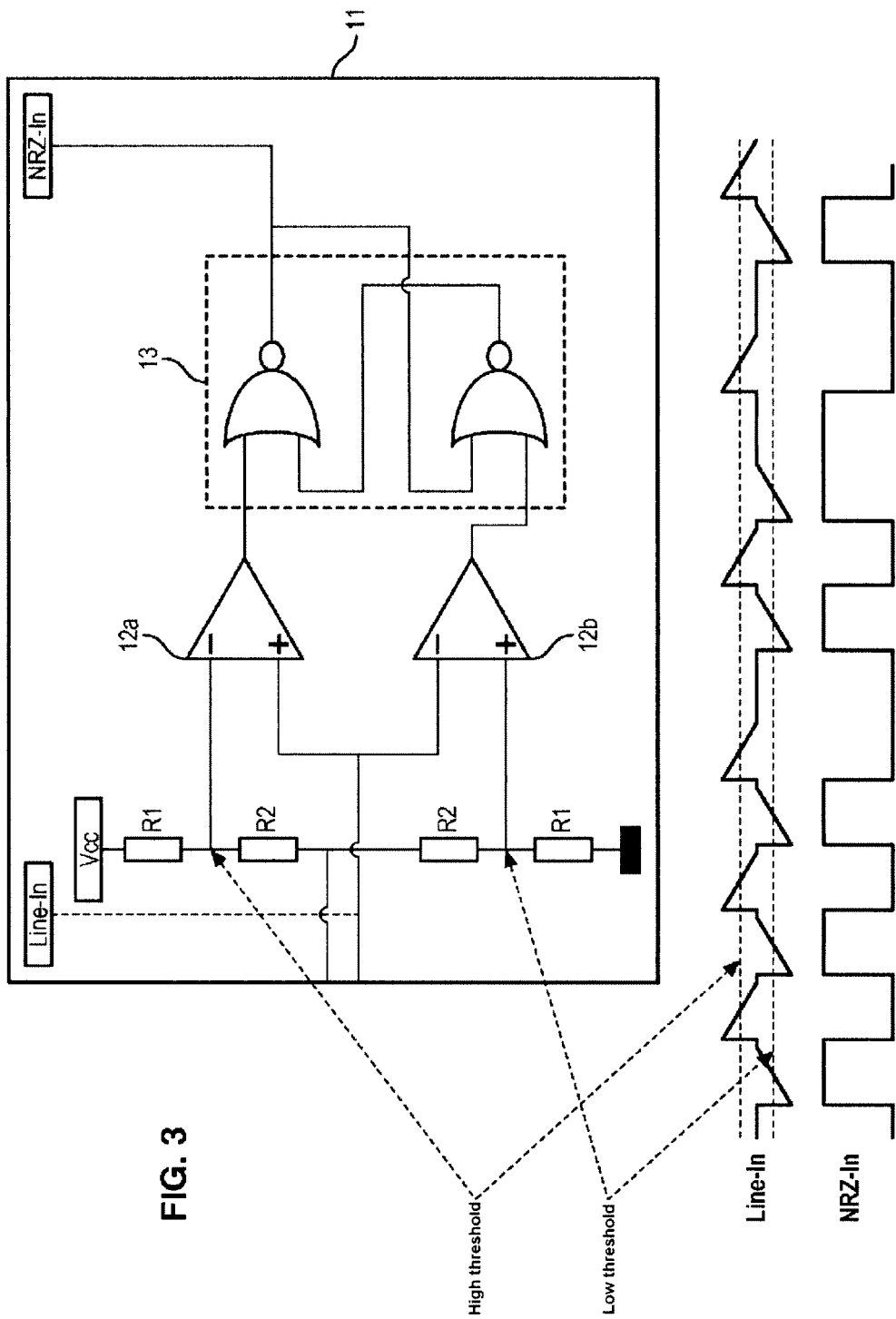
FIG. 3 shows a Schmitt trigger which can be used within the framework of the invention to reconstitute the binary states of the baseband serial signal.

Here, it is noted that the binary states need not be transmitted over the communication channel between the transmitter and the receiver, but only their transitions. The transmission channel thus carries the rising and falling edges of the baseband serial signal. In such a hypothetical case, the clock reconstruction device 1 advantageously includes a Schmitt trigger capable of reconstructing the binary states. As shown in FIG. 3, the Schmitt trigger 11 can in particular be implemented by two simple comparators 12a, 12b (comparator 12a comparing the signal received from the communication channel "Line-In" with a high threshold, comparator 12 comparing the signal received from the communication channel "Line-In" with a low threshold) followed by an RS flip-flop 13 providing storage for transient states and providing the NRZ-In message.

Returning to FIG. 1, the clock reconstruction device 1 includes a pulse generator 2 designed to generate pulses at each transition, falling or rising, of the received message NRZ-D.

According to a possible embodiment, the pulse generator circuit 2 includes a delay line 3 for delaying the received message NRZ-D by one half-period of the data bit of the said message NRZ-D. The delay line 3 provides at its output a received digital message NRZ-R delayed by one half-bit (see timing diagram in FIG. 2).

The delay line 3 is preferably a distributed constant line (that is a matched line whose length depends on the desired delay). In such a hypothetical case, the pulse generator circuit can advantageously be incorporated into a monolithic integrated circuit.

The delay line 3 may also consist of a lumped constant line (in the form of a series of LC networks), or a high-commutation-rate shift register, or even by arranging a series of elementary logic gates in series.

The pulse generator circuit 2 also includes an Exclusive-OR logic gate 4 allowing comparison of the received message NRZ-D and the delayed received message NRZ-R. The transitions, rising or falling, of the received message NRZ-D are thus flagged in the Cde-S message, available at the output of the Exclusive-OR gate 4, by a logical state 1 with a duration corresponding to a half-period of the data bit of the received message.

A timing diagram of the Cde-S message, corresponding to the output of the pulse generator circuit 2, is shown in FIG. 2.

The clock reconstruction device 1 also includes a phase-locked loop 5 allowing the creation of a phase-locked coupling (one stable position in 360°) at the time of the transitions when they occur (that is at predetermined positions in time) but which can be absent during series of 0s or 1s in the received message NRZ-D. The loop 5 is thus able to reconstitute the bit clock of an NRZ message, while still tolerating absences of transitions. It should be noted that the inventors were able to verify the successful operation of the clock reconstruction device despite absences of transitions affecting as many as 3,000 consecutive bits.

The loop 5 includes a voltage-controlled oscillator 6 (also called a VCO) which generates a periodic oscillator output signal VCO-S whose frequency is proportional to the voltage applied at its input, and a filter 7 providing a setpoint signal VCO-E to the oscillator 6.

Oscillator 6 is preferably a voltage-controlled quartz oscillator (VCXO or "voltage controlled crystal oscillator"). In fact, a VCXO has a very limited (less than 1% of the center frequency) and perfectly known output frequency range.

Loop 5 also includes a switch 8 inserted between the oscillator 6 and the filter 7, whose switching is controlled by the Cde-S output of the pulse generator circuit 2.

When the loop is phase-locked, a rising transition of the output of VCO oscillator 6 occurs during the conduction period of switch 8. At the output of switch 8, the electrical state of the line varies between:

High impedance, switch open. The low-pass filter 7 maintains analog memory of the previously sampled voltage.

Logic Level 0: electrical value near 0V.

Logic Level 1: electrical value near the logic circuit supply voltage (typically 5V, 3.3V, 2.5V).

When switch 8 is closed, that is when the pulse generator circuit 2 sets signal Cde-S to 1 (active state), the low-pass filter 7 integrates an average component that depends on the phase error of signal VCO-S at the output of controlled oscillator 6. If the phase is offset one way, the average voltage increases and the frequency of signal VCO-S also increases; if the phase is offset the other way, the frequency decreases. These frequency offsets bring about increases or reductions in the average components, tending to make the system converge to a stable, phase-coupled position.

It will be noted here that two phases are theoretically stable (0° and 360°), but that only one actually is. In actuality, in one case the equilibrium is convergent (a small disturbance generates a voltage tending to return toward the equilibrium point), and in the other case, the equilibrium is divergent (a small disturbance will generate a greater imbalance, and ultimately a 180° rotation to reach stable and convergent equilibrium).

In the absence of a pulse generated by the pulse generator circuit 2, the switch 8 is open and the filter 7 then stores a constant level signal to provide the setpoint signal VCO-E to oscillator 6.

More specifically, the low-pass filter 7 includes components designed:

once the loop is locked, when the switch 8 is closed, to charge if the oscillator output signal VCO-S is in the high state or to discharge if the oscillator output signal is in the low state, so as to provide an average setpoint signal to the oscillator;

when switch 8 is open, to store the voltage so as to provide a constant setpoint signal VCO-E to the oscillator;

to provide a function of filtering (reducing) the phase noise of the reconstituted clock as compared with the phase noise of the arriving message.

It will be noted that the tests carried out by the inventors have shown strong insensitivity to the absence of transitions (up to 3,000 consecutive bits), far beyond real needs, as well as good ability to reduce phase noise in the case of consecutive chaining of couplers of the same type.

It will also be noted that, the input impedance of the VCO 6 being considered infinite, it has no impact on the charging or discharging of the capacitors of filter 7.

The low-pass filter 7 allowing this performance to be attained has two cutoff frequencies. This can be a first-order passive filter, for example.

A first cutoff frequency (very low frequency cutoff) is connected with components R1 and C2. It is this first low-frequency cutoff frequency which primarily provides the "long term" storage function in the event of absence of transitions in the received message. As an example, a very good compromise was achieved by the Applicant with a low cutoff made with an RC network made up of 1 kohm (R1) and 499 ohm (R2) resistors and a 2.2 µF capacitor (C2). Under these conditions, the resistance to the absence of binary transitions is at least 3,000 bits for a 25 Mbit/s message. The stated values must preferably be met with a tolerance of less than 20%.

An attenuator network (R1 and R2) allows a sufficient residual loop gain up to the second (high frequency) cutoff frequency connected with R1 and C1. It is this second cutoff frequency that allows the best compromise between stability (phase margin) and transient response rate, while mainly providing filtration of phase noise in the received message.

The high cutoff frequency in fact allows the high frequency loop gain to be limited with the object of reconstructing a message compliant with the foregoing with attenuated phase noise. The Applicant has sought out the best with respect to maximizing loop stability criteria (phase margin), tracking rate and noise reduction. The values that gave a very good compromise are 1 kohm (R1) and 22 nF (C1), with a tolerance preferably better than 20%.

FIG. 2 shows the timing diagrams:

of the Cde-S message output by the pulse generator circuit used to control the opening and closing of switch 8;

of the Cde-VCO message corresponding to the setpoint signal of oscillator 6 prior to filtering;

of the VCO-E message corresponding to the setpoint signal of oscillator 6 after filtering;

of the VCO-S message corresponding to the output of oscillator 6.

As stated earlier, the Cde-S message shows a pulse resulting from a transition in the received message NRZ-D.

The Cde-VCO message is thus at the value stored in C1 and C2 in the absence of a pulse (switch 8 is then open), while it duplicates the VCO-S output of the oscillator in the presence of a pulse (switch 8 is then closed).

The VCO-E message output by the filter 7 is thus constant when the Cde-S message is inactive (low state) in the absence of a transition (the filter then acting, through its capacitors, as an analog memory capable of storing and delivering a constant setpoint signal to the oscillator), while filter 7 provides an averaged control voltage to the oscillator when the Cde-VCO message duplicates the VCO-S output of the oscillator (the filter then acting, through the charging and discharging of its capacitors, as a low-pass filter allowing a stable voltage to be provided to the oscillator).

To the extent that a stable control voltage is provided by the filter (in its low-pass role) to the oscillator, the low-pass function of the filter 7 also allows a frequency with low phase and amplitude noise to be obtained at the output of oscillator 6, which makes it possible after sampling to reconstruct an NRZ message with lower phase noise than the original.

The clock reconstruction device 1 also includes a flip-flop 9 allowing the received serial signal to be resynchronized.

As shown in FIG. 1, the flip-flop 9 duplicates at output Q (output message NRZ-S whose timing diagram is shown in FIG. 2) the signal available at input D (delayed received message NRZ-R) at each descending edge of the oscillator output signal VCO-S.

The clock reconstruction device 1 also includes an inverter 10 (NOT logic gate) allowing the oscillator output signal VCO-S to be inverted to obtain the reference clock Hor-S for sampling the resynchronized output message NRZ-S.

Besides its function of reconstruction of the bit clock of the received serial digital message that tolerates the absence of transitions, and its function of regenerating the received serial digital message while reducing phase and amplitude noise, the device according to the first aspect of the invention has the following advantages:

it is relatively simple and easily reproducible;

it can be implemented in an ASIC or in a mixed (analog and digital) FPGA;

it can operate at high clock rates (several tens of MHz);

it does not employ complex components, and is thus easily justifiable with respect to aeronautical standard DO254.

In the foregoing, an analog implementation of the device according to the first aspect of the invention has been described. The invention is not limited, however, to this type of implementation and can in this regard be implemented in a fully digital version (shift register for the delay function, digital VCO oscillator, low-pass filter 7 replaced by a digital accumulator). It will be noted that this digital version is more specifically intended for low frequency applications (for example up to 1 Mbit/s).

It is further stated that the invention is not limited to a device according to its first aspect, but also extends to a system for transmitting digital data over a baseband serial link, including a transmitter and a receiver connected by a transmission channel, where the receiver includes a device according to the first aspect of the invention.

One example of such a system is an avionics system connecting a central controller (transmitter) to one or more remote peripherals of the sensor or flight control actuator type (receivers) through a communication channel. The communication channel may in particular be a bidirectional data communication channel. The line connecting the controller to the peripheral can also be shared for the transmission of electrical power and bidirectional data.

The invention claimed is:

1. A device (1) for reconstructing a clock signal of a baseband serial signal (NRZ-D), including:
    a pulse generator circuit (2) designed to generate pulses at each transition, rising or falling, of the baseband serial signal (NRZ-D);
    a phase-locked loop (5) including a voltage-controlled oscillator (6) which generates an oscillator output signal (VCO-S) and a filter (7) providing a setpoint signal (VCO-E) to the oscillator (6), the phase-locked loop (5) also including a switch (8) inserted between the oscillator (6) and the filter (7) whose switching is controlled by the output (Cde-S) of the pulse generator circuit (2), and in which the filter (7) is a low-pass filter, such that:
    in the presence of a pulse generated by the pulse generator circuit (2), the switch (8) is closed and the filter (7) then averages the oscillator output signal (VCO-S) passing through the switch to provide the setpoint signal (VCO-E) to the oscillator;
    in the absence of a pulse generated by the pulse generator circuit (2), the switch (8) is open and the filter (7) then stores a constant level signal to deliver the setpoint signal (VCO-E) to the oscillator;
    wherein the filter (7) comprises a first and a second RC cell respectively having a first cutoff frequency, and a second cutoff frequency, the first RC cell cutoff frequency being lower than the second RC cell cutoff frequency, the first RC cell providing a storage function when there is an absence of transitions in the baseband serial signal, and the second RC cell providing filtering of phase noise in the received message.

2. The device as claimed in claim 1, in which the pulse generator circuit (2) generates pulses whose duration corresponds to a half-period of the data bit of the baseband serial signal (NRZ-D).

3. The device as claimed in claim 2, in which the pulse generator circuit (2) includes a delay line (3) to delay the baseband serial signal (NRZ-D) by one half-period of the data bit of the said baseband serial signal, and an Exclusive-OR logic gate (4) allowing comparison of the baseband serial signal (NRZ-D) with the baseband serial signal (NRZ-R) delayed by the delay line (3).

4. The device as claimed in claim 3, in which the delay line (3) is a distributed constant line.

5. The device as claimed in claim 4, in which the pulse generator circuit (2) is incorporated into a monolithic integrated circuit.

6. The device as claimed in claim 1, in which the filter (7) capacitors of the first and second RC cells are configured to:
    once the loop is locked, when the switch is closed, charge if the oscillator signal is in a high state, and discharge if the oscillator output signal is in a low state, so as to deliver an average setpoint signal to the oscillator; and
    when the switch is open, store the voltage so as to provide a constant setpoint signal to the oscillator.

7. The device as claimed in claim 1, including a flip-flop allowing the baseband serial signal to be resynchronized by duplicating the said signal at each falling edge of the oscillator output signal (VCO-S).

8. The device as claimed in claim 1, wherein the oscillator is a voltage-controlled quartz oscillator.

9. The device as claimed in claim 1, in which the baseband serial signal is an NRZ signal.

10. The device as claimed in claim 1, in which the baseband serial signal is received from a transmission line carrying the rising or falling edges of the baseband serial signal, and also including a Schmitt trigger capable of reconstructing the binary states of the message of the baseband serial signal.

11. The device as claimed in claim 10, also including an inverter (10) allowing inversion of the oscillator output signal (VCO-S) to obtain the reference clock (Hor-S) for sampling the resynchronized output message (NRZ-S).

12. A system for transmitting digital data over a baseband serial link, including a transmitter and a receiver connected by a transmission channel, wherein the receiver includes said device for reconstructing the clock signal as defined in claim 1.

* * * * *